(12) United States Patent
Hanft et al.

(10) Patent No.: US 10,064,301 B2
(45) Date of Patent: Aug. 28, 2018

(54) MEDIA-TIGHT HOUSING

(71) Applicant: ZF Friedrichshafen AG, Friedrichshafen (DE)

(72) Inventors: Hans-Jürgen Hanft, Pegnitz (DE); Hermann Thurn, Eckersdorf (DE)

(73) Assignee: ZF Friedrichshafen AG, Friedrichshafen ( * ) Notice: Subject to any disclaimer, the term of this patent is extended or adjusted under 35 U.S.C. 154(b) by 0 days.

(21) Appl. No.: 15/505,351

(22) PCT Filed: Jul. 22, 2015

(86) PCT No.: PCT/EP2015/066692
§ 371 (c)(1),
(2) Date: Feb. 21, 2017

(87) PCT Pub. No.: WO2016/026642
PCT Pub. Date: Feb. 25, 2016

(65) Prior Publication Data
US 2017/0273205 A1 Sep. 21, 2017

(30) Foreign Application Priority Data
Aug. 22, 2014 (DE) .......... 10 2014 216 765

(51) Int. Cl.
*H05K 5/06* (2006.01)
*H05K 5/00* (2006.01)
(Continued)

(52) U.S. Cl.
CPC ............. *H05K 5/069* (2013.01); *B60R 16/03* (2013.01); *H02B 1/20* (2013.01); *H05K 5/0026* (2013.01);
(Continued)

(58) Field of Classification Search
CPC .......... H05K 5/00; H05K 5/06; H05K 5/0069; H05K 5/0026; H05K 9/0018;
(Continued)

(56) References Cited

U.S. PATENT DOCUMENTS 4,593,970 A * 6/1986 Rhodes ................ G02B 6/4428
174/70 S
5,571,606 A * 11/1996 Ackermann ............ H01F 6/065
174/125.1
(Continued)

FOREIGN PATENT DOCUMENTS

DE 43 21 719 C1 10/1994
EP 2 661 161 A1 11/2013

OTHER PUBLICATIONS

International Search Report dated Oct. 7, 2015 in International Application No. PCT/EP2015/066692, 5 pages, German Language.
(Continued)

*Primary Examiner* — Angel R Estrada
(74) *Attorney, Agent, or Firm* — Brinks Gilson & Lione

(57) ABSTRACT

The present disclosure relates to an assembly comprising a housing and at least one busbar for connecting a printed circuit board disposed in the housing to a power supply present outside the housing, wherein the housing has a penetration, from which the busbar projects, wherein a magnetic core and a gasket accommodating the magnetic core are placed in the housing penetration in a media-tight manner, and the gasket, together with the magnetic core, encompasses the busbar in a form-fitting manner.

20 Claims, 1 Drawing Sheet

(51) Int. Cl.
*H05K 9/00* (2006.01)
*B60R 16/03* (2006.01)
*H02B 1/20* (2006.01)
*H01F 17/06* (2006.01)

(52) U.S. Cl.
CPC ......... *H05K 5/0069* (2013.01); *H05K 9/0018* (2013.01); *H05K 9/0098* (2013.01); *H01F 2017/065* (2013.01)

(58) Field of Classification Search
CPC ...... H05K 9/0098; H05K 5/069; H01F 17/06; H01F 2017/065; H02B 1/20; B60R 16/03

USPC ...... 174/152 GM, 125.1, 50, 520, 50.6, 650, 174/50.5, 50.52; 361/302, 303, 307
See application file for complete search history.

(56) References Cited

U.S. PATENT DOCUMENTS

| | | | | |
|---|---|---|---|---|
| 6,903,268 | B2 * | 6/2005 | Marshall | A61N 1/3754 174/152 GM |
| 8,288,654 | B2 * | 10/2012 | Taylor | A61N 1/05 174/152 GM |
| 8,536,468 | B2 * | 9/2013 | Teske | A61N 1/3754 174/152 GM |
| 8,653,384 | B2 * | 2/2014 | Tang | A61N 1/3754 174/152 GM |
| 2012/0230005 | A1 | 9/2012 | Ota | |
| 2013/0085402 | A1 | 4/2013 | Callahan et al. | |
| 2013/0192888 | A1 | 8/2013 | Konz | |

OTHER PUBLICATIONS

International Search Report dated Oct. 7, 2015 in International Application No. PCT/EP2015/066692, 3 pages, English Language.
Written Opinion of the International Search Authority dated Feb. 25, 2016 in International Application No. PCT/EP2015/066692, 4 pages, German Language.

* cited by examiner

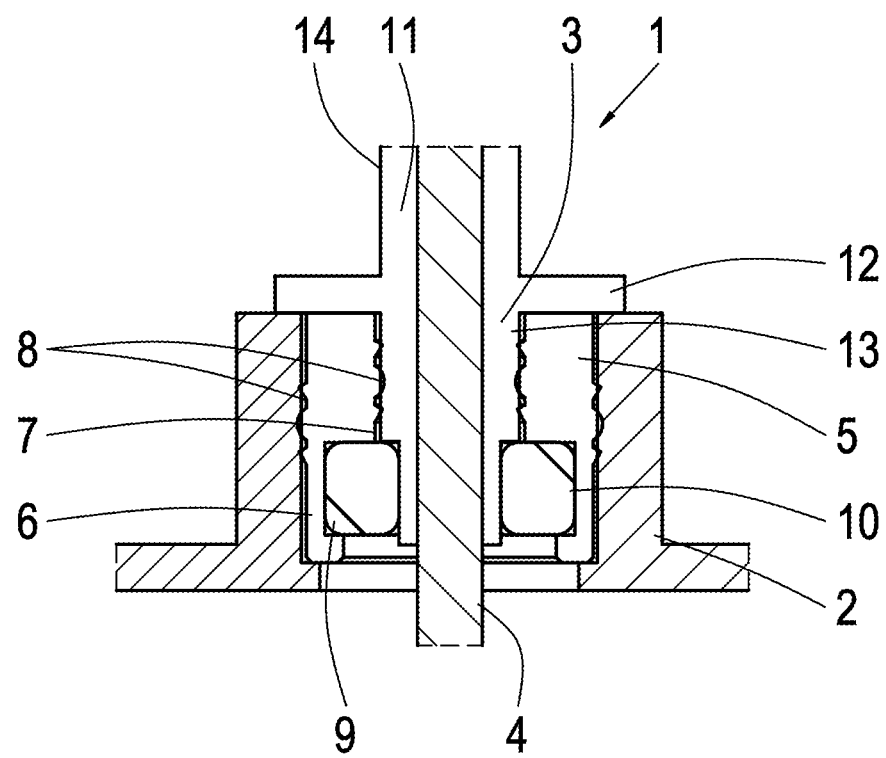

MEDIA-TIGHT HOUSING

CROSS-REFERENCE TO RELATED APPLICATIONS

This application is a filing under 35 U.S.C. § 371 of International Patent Application PCT/EP2015/066692, filed Jul. 22, 2015, and claims the priority of DE 10 2014 216 765.5, filed Aug. 22, 2014. These applications are incorporated by reference herein in their entirety.

BACKGROUND OF THE INVENTION

Field of the Invention

The present disclosure relates to an assembly comprising a housing and at least one busbar for connecting a printed circuit board disposed in the housing to a power supply present outside the housing, wherein the housing has a penetration through which the busbar extends.

Background

In drive devices for motor vehicles, having an internal combustion-electric power train, printed circuit boards are used to control and regulate the electric machine. These printed circuit boards are normally positioned spatially in close proximity to the electric machine in the associated control devices. This position requires an appropriate feed for the power supply. It has proven to be disadvantageous thereby that, due to the not negligible supply of the power supply to the printed circuit board, high-frequency disruptions in the supply lines to the printed circuit board can arise. Furthermore, it must however also be ensured that the printed circuit board is sealed in a media-tight manner, such that the printed circuit board is not subjected to any damage through environmental factors, e.g. water.

BRIEF SUMMARY OF THE INVENTION

The object of the disclosure is to create a generic assembly in which a printed circuit board is accommodated such that it is protected in a media-tight manner, while ensuring an uninterrupted power supply.

This object is achieved with the assembly in accordance with the features of the applicable claim 1. Further advantageous designs of the disclosure can be derived from the description, the claims, and the drawings.

The disclosure is based on an assembly comprising a housing and at least one busbar for connecting a printed circuit board disposed in the housing to a power supply present outside the housing, wherein the housing has a penetration, through which the busbar extends.

The assembly has a magnetic core and a gasket that accommodates the magnetic core, which is placed in the housing penetration in a media-tight manner. Furthermore, the gasket with the magnetic core encompasses the busbar in a form-fitting manner.

In this manner, it is ensured, on one hand, that high-frequency disruptions in the busbar are damped, and on the other hand, that the printed circuit board is protected from environmental factors.

In particular, the busbar has a contact on its end lying inside the hosing, by means of which a connection to a contact point on the printed circuit board can be produced. The busbar has a contact on its end lying outside the housing, by means of which a connection to a power supply can be produced.

In one design, the busbar has a plastic insulation. This plastic insulation serves to protect the busbar against corrosion or other damage. The plastic insulation can be, e.g., a thermoplastic or a thermoset.

In another design, the plastic insulation is present in a busbar section in the region of the housing penetration and/or in a section outside the housing.

As a matter of course, the assembly can also contain numerous busbars. In this case, each busbar is assigned at least one magnetic core. It is also possible, however, that one magnetic core encompasses numerous busbars. The busbars can be disposed thereby in a shared gasket. It is however also possible for each busbar to be disposed in a single gasket. One advantage of an assembly in a shared gasket is that, as a result, it is possible to create a space-saving arrangement of the busbars.

A method for installing an assembly according to the disclosure can provide the insulation of the busbar with the plastic insulation in a first step. In a second step, a magnetic core is placed in a gasket. In a third step, the gasket, together with the magnetic core, is slid over the busbar and

BRIEF DESCRIPTION OF THE DRAWING

The disclosure shall be explained below in greater detail, based on a FIGURE.

The FIGURE shows schematically a section of an assembly according to the disclosure, in a cross section.

DETAILED DESCRIPTION OF THE INVENTION

The assembly 1 has a housing 2, which has an opening 3. A busbar 4 is inserted through the opening 3. The busbar 4 connects an external power supply (not shown) to a printed circuit board (not shown), wherein the printed circuit board is positioned in the interior of the housing 2.

A gasket 5 can be seen in the opening 3 of the housing 2. The gasket 5 has a substantially annular design, and has a radial recess 9 in the region of its inner radius 7, in which the magnetic core 10 can be placed. The magnetic core 10 is designed as a single- or multi-piece annular core. As a matter of course, the magnetic core 10 can also be designed as a C or U core.

It is, however, also conceivable that the magnetic core 10 is integrated in the gasket 5, i.e. the gasket 5 encompasses the magnetic core 10 in its entirety. The gasket 5 has a circumferential sealing lip 8 in the region of its outer radius 6 and/or in the region of its inner radius 7. These sealing lips 8 serve, on one hand, to ensure that no moisture can get between the housing 2 and the gasket 5, or between the gasket 5 and the busbar 4 in the housing. On the other hand, these sealing lips 8 serve to secure the gasket permanently in the opening 3 of the housing 2, and to prevent the gasket 5 from falling out of the opening 3, e.g. due to vibrations.

The busbar 2 is sprayed with a plastic insulation 11. The plastic insulation 11 is provided thereby in a section 13 of the busbar 4 in the region of the housing opening 3 and in a section 14 of the busbar 4 outside the housing 2. For practical purposes, the plastic insulation 11 has a collar 12. This collar 12 bears on the housing 2, and serves, on one hand, as a stop for the busbar 4 during installation of the busbar 4, and on the other hand, as a supplementary seal.

Moisture is prevented from getting into a region between the gasket 5 and the housing 2 by the collar 12 formed by the plastic insulation 11.

REFERENCE SIGNS

1 Assembly
2 Housing
3 Opening
4 Busbar
5 Gasket
6 Outer radius
7 Inner radius
8 Sealing ring
9 Recess
10 Magnetic core
11 Insulation
12 Collar
13 Section of the busbar
14 Section of the busbar

The invention claimed is:

1. An assembly comprising:
a housing and
a busbar configured for connecting a printed circuit board disposed in the housing to a power supply located outside the housing,
wherein the housing has an opening, through which the busbar projects,
wherein a magnetic core and a gasket that accommodates the magnetic core are placed in the opening, and the gasket, together with the magnetic core, encompasses the busbar.

2. The assembly according to claim 1, wherein the busbar has a plastic insulation.

3. The assembly according to claim 2, wherein the plastic insulation is present in a busbar section in the region of the opening and in a section outside the housing.

4. The assembly according to claim 2, wherein the plastic insulation is present in a busbar section in the region of the opening or in a section outside the housing.

5. The assembly according to claim 1, wherein the magnetic core and the gasket are placed in the opening in a media-tight manner.

6. The assembly according to claim 1, wherein the gasket and magnetic core encompass the busbar in a form-fitting manner.

7. The assembly according to claim 1, wherein the busbar comprises a contact on an end located inside the housing.

8. The assembly according to claim 1, wherein the busbar comprises a contact on an end located outside the housing.

9. The assembly according to claim 2, wherein the plastic insulation comprises thermoplastic or thermoset.

10. The assembly according to claim 1, wherein the busbar is a first busbar and the assembly further comprises a second busbar that projects through the opening, wherein the first and second busbars are each encompassed by separate magnetic cores.

11. The assembly according to claim 1, wherein the busbar is a first busbar and the assembly further comprises a second busbar that projects through the opening, wherein the first and second busbars are both encompassed by one magnetic core.

12. The assembly according to claim 1, wherein the gasket has a substantially annular shape.

13. The assembly according to claim 1, wherein the magnetic core resides in a recess located in the inner radius of the gasket.

14. The assembly according to claim 1, wherein the magnetic core has a substantially annular shape.

15. The assembly according to claim 14, wherein the magnetic core has a C or U shape.

16. The assembly according to claim 1, wherein the magnetic core is comprised of multiple pieces.

17. The assembly according to claim 1, wherein the gasket comprises a first sealing lip on an outer radius, wherein the first sealing lip prevents moisture from entering between the gasket and the housing.

18. The assembly according to claim 1, wherein the gasket comprises a second sealing lip on an inner radius, wherein the second sealing lip is configured to prevent moisture from entering between the gasket and the busbar.

19. The assembly according to claim 2, wherein the plastic insulation comprises a collar that is configured to limit movement of the busbar into the opening.

20. The assembly according to claim 19, wherein the collar is configured to prevent moisture from entering between the gasket and the housing.

* * * * *